US006347287B1

(12) United States Patent
Beckett et al.

(10) Patent No.: US 6,347,287 B1
(45) Date of Patent: Feb. 12, 2002

(54) CALIBRATION SYSTEM AND METHOD FOR RECEIVER GUARDBAND REDUCTIONS

(75) Inventors: Michael F. Beckett, Essex; Christopher J. Ford, Essex Junction; Donald S. Moran, Westford; Gene T. Patrick, Richmond, all of VT (US); Sami M. Shaaban, Austin, TX (US); George W. Twombly, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/307,395

(22) Filed: May 7, 1999

(51) Int. Cl.[7] .............................................. G01D 18/00
(52) U.S. Cl. ............................ 702/89; 73/1; 324/158.1; 324/617; 702/75; 702/85; 702/FOR 156; 702/FOR 170; 714/301
(58) Field of Search .............................. 702/75, 85, 89, 702/73; 324/158.1, 617; 364/571, 579, 702, FOR 156, FOR 170; 714/301; 73/1

(56) References Cited

U.S. PATENT DOCUMENTS

| | | | | |
|---|---|---|---|---|
| 4,827,437 A | | 5/1989 | Blanton | 364/571.01 |
| 5,131,272 A | * | 7/1992 | Minei et al. | 73/431 |
| 5,256,964 A | | 10/1993 | Ahmed et al. | 324/158 |
| 5,262,716 A | | 11/1993 | Gregory, Jr. et al. | 324/158 |
| 5,471,145 A | | 11/1995 | Mydill | 324/601 |
| 5,539,305 A | | 7/1996 | Botka | 324/158.1 |
| 5,558,541 A | | 9/1996 | Botka et al. | 439/675 |
| 5,589,765 A | * | 12/1996 | Ohmart et al. | 324/158.1 |
| 5,794,175 A | * | 8/1998 | Conner | 702/119 |

FOREIGN PATENT DOCUMENTS

JP 8226957 9/1996

OTHER PUBLICATIONS

IBM Technical Disclosure Bulletin, "Quick Tester Calibration Using Standard Chips as Multiplexers." vol. 37, No. 02A, Feb. 1994.
IBM Technical Disclosure Bulletin, "Calibration Method For Testers." vol. 34, No. 11, Apr. 1992.
IBM Technical Disclosure Bulletin, "Self–Timed Performance Test For Stand–Alone Random–Access Memories." vol. 30, No. 5, Oct. 1987.

* cited by examiner

*Primary Examiner*—Arthur T. Grimley
*Assistant Examiner*—John Le
(74) *Attorney, Agent, or Firm*—Downs Rachlin Martin PLLC

(57) ABSTRACT

A method of and system for determining calibration offsets to account for delays introduced "downstream" of the reference driver (24) of a tester system (18) to test electronic components such as SRAM semiconductor memory devices. Such delays are created by, among other elements, receiver channels (30) of the tester system. A plurality of calibration modules (100) are provided, one for each receiver channel. Each calibration modules has a transmission line (110) with a known delay, a first contact 102' and a second contact 102". The tester system includes a socket (52) having a plurality of contactors (54) for contacting the reference clock contact and data output contacts of the electronic components undergoing test. The first contact of each calibration module is positioned to engage the contactor that engages the reference clock contact of the electronic component. The second contact of each calibration module is positioned to engage a contactor that is different than the contactors that the second contacts of other calibration modules engage. Calibration offsets arising from delays introduced "downstream" of the tester system driver are determined for each receiver channel by subtracting the known delay for a calibration module associated with the receiver channel from the time between when (i) a test signal is provided by the reference driver at $t_0$ and (ii) when the test signal is received at the receiver channel.

28 Claims, 3 Drawing Sheets

CALIBRATION SYSTEM AND METHOD FOR RECEIVER GUARDBAND REDUCTIONS

FIELD OF THE INVENTION

The present invention pertains to a system and method for calibrating testers used to test electronic components such as semiconductor devices.

BACKGROUND OF THE INVENTION

Following fabrication and packaging, semiconductor devices are tested to ensure they operate as intended and to quantify various critical operating parameters, e.g., access time. Based on this testing, the devices are then sorted into various categories as a function of their operating characteristics, with the higher performing devices selling for more than lower performing devices.

Semiconductor chip testers are routinely calibrated and offsets are provided as a result of such calibration to ensure that test measurements are as accurate as possible. Unfortunately, known tester calibration techniques do not adequately address the behavior of tester receivers, cabling, fixturing, contactors and other elements "downstream" of the tester driver, with the result that tester offsets, which account for introduced element delays, cannot be accurately determined.

To ensure devices falling within a given sort category meet the performance requirements for that category, it is necessary to provide a guardband to account for the full extent of delay potentially introduced by the fixturing, product contactors and other elements. Thus, for example, for a chip having a target access time of 1,000 picoseconds, it may be necessary to reject all devices having a measured access time of 900 picoseconds and slower, with the difference between these two values being the guardband. If the guardband can be reduced, some of the devices falling into a lower sort category will necessarily fall in a higher sort category, resulting in an increased total chip revenue.

Known tester calibration techniques only indirectly address tester fixture delay, and additionally suffer from other drawbacks. One technique involves the use of a known good part having carefully quantified operating parameters, i.e., a "golden device." By subtracting known delay in the golden device from delays otherwise introduced by the tester, offsets accounting for such delays can be generated and used in testing future products. Unfortunately, because the golden device is active, its operating parameters change slightly with changes in temperature, voltages applied, and other factors, arising from operation. To account for this variability, guardbands must be applied to the known delay of the golden device, thereby giving rise to the test yield problems referenced above.

Other known calibration techniques use programmable, active delays. Typically, such techniques involve the use of a relay matrix that switches an active delay element between tester channels. In addition to the cumbersome fixturing associated with the use of this calibration technique, and a lengthy calibration time, e.g. three to four hours, the relays in the matrix introduce delay which must also be accounted for by guardbanding.

U.S. Pat. No. 5,256,964 to Ahmed et al. ("the '964 patent"), describes the use of active delay elements in connection with tester calibration. While the method and system of the '964 patent is believed to constitute an advance in the art, it suffers from some of the problems associated with active known delay elements that are discussed above.

SUMMARY OF THE INVENTION

One aspect of the present invention is a method of calibrating a tester used to test an electronic component, the tester having a driver, a receiver channel, and an interface for connecting the driver and the receiver channel to the electronic component. A first step in the method comprises providing a passive calibration module having an electrical path with a known delay. Next, the calibration module is connected with the interface so that a test signal may be provided to the calibration module via the driver and carried by the electrical path to the receiver channel. Finally, the test signal is provided via the driver at $t_0$.

Another aspect of the present invention is a method of calibrating tester receiver channels before testing electronic components. The method includes the steps of providing a tester for testing electronic components, the tester having a plurality of receiver channels, and providing a test signal having a known characteristic to at least one of the receiver channels. Then, a measurement of the known characteristic is performed and the receiver is calibrated by comparing the known characteristic with the measurement of the characteristic. Finally, an offset is created based on a difference between the known characteristic and the measurement.

Still another aspect of the invention is a tester calibration system for testing a DUT (device under test) having a reference clock contact and a plurality of data output contacts. The system comprises a tester and a socket for receiving a DUT, the socket being connected to the tester and having a plurality of contactors for making electrical contact with the reference clock contact and the plurality of data output contacts of the DUT. The system also includes a plurality of calibration modules, each having a first contact, a second contact and a transmission line with a known delay connected between the first contact and the second contact. Each of the plurality of calibration modules (i) is sized for receipt in the socket, (ii) has said first contact positioned to contact the contactor that contacts the reference clock contact of the DUT and (iii) has the second contact positioned to contact a corresponding respective one of the contactors that is different than ones of the contactors that the second contacts on others of the plurality of calibrations modules contact.

DETAILED DESCRIPTION OF THE INVENTION

The present invention is a method of calibrating testers of the type used to test electronic components such as SRAM memory devices so as to permit reduction in the guardband associated with sort categories for the electronic components. In addition, the present invention encompasses a tester system and set of calibration modules for use in practicing the method.

Figure 1:
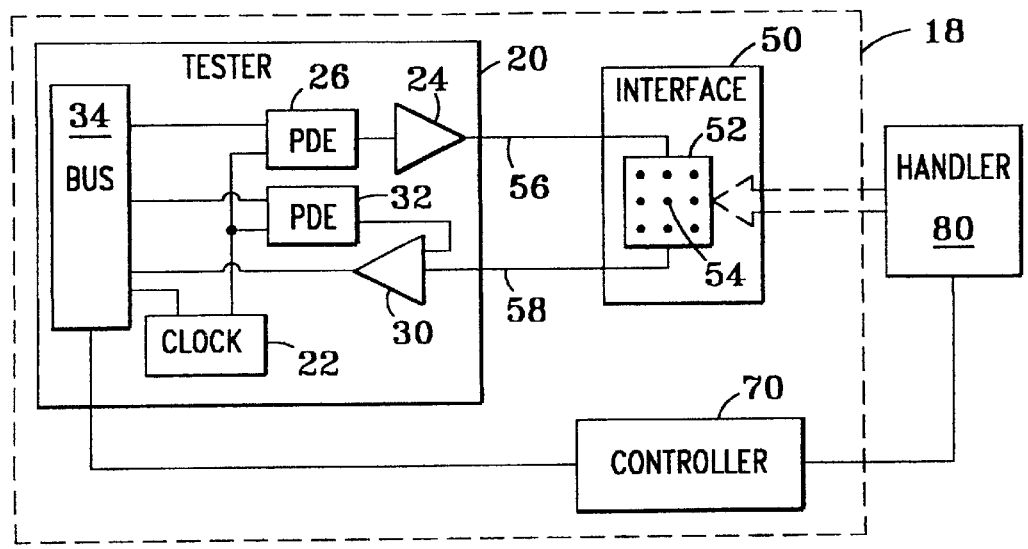
FIG. 1 is a schematic diagram of the tester system and handler used to perform the calibration method of the present invention.

Referring to FIG. 1, the calibration method of the present invention is accomplished using a tester system 18 of the type used to test semiconductor devices. A suitable system 18 is sold by Hewlett Packard of Palo Alto, Calif., and is identified by model number HP83000. System 18 includes a tester 20 having a master clock 22, a reference driver 24 and a PDE (programmable delay element) 26 connected between the master clock and the input to the reference driver. Although not illustrated, tester 20 includes a plurality of other drivers, with reference driver 24 functioning as a reference for the others in connection with access time sorting of electronic components being tested. PDE 26 provides an offset to the clock signal generated by master clock 22 to account for delays introduced by reference driver 24 in accordance with calibration methods not forming part of the present invention.

Figure 1A:
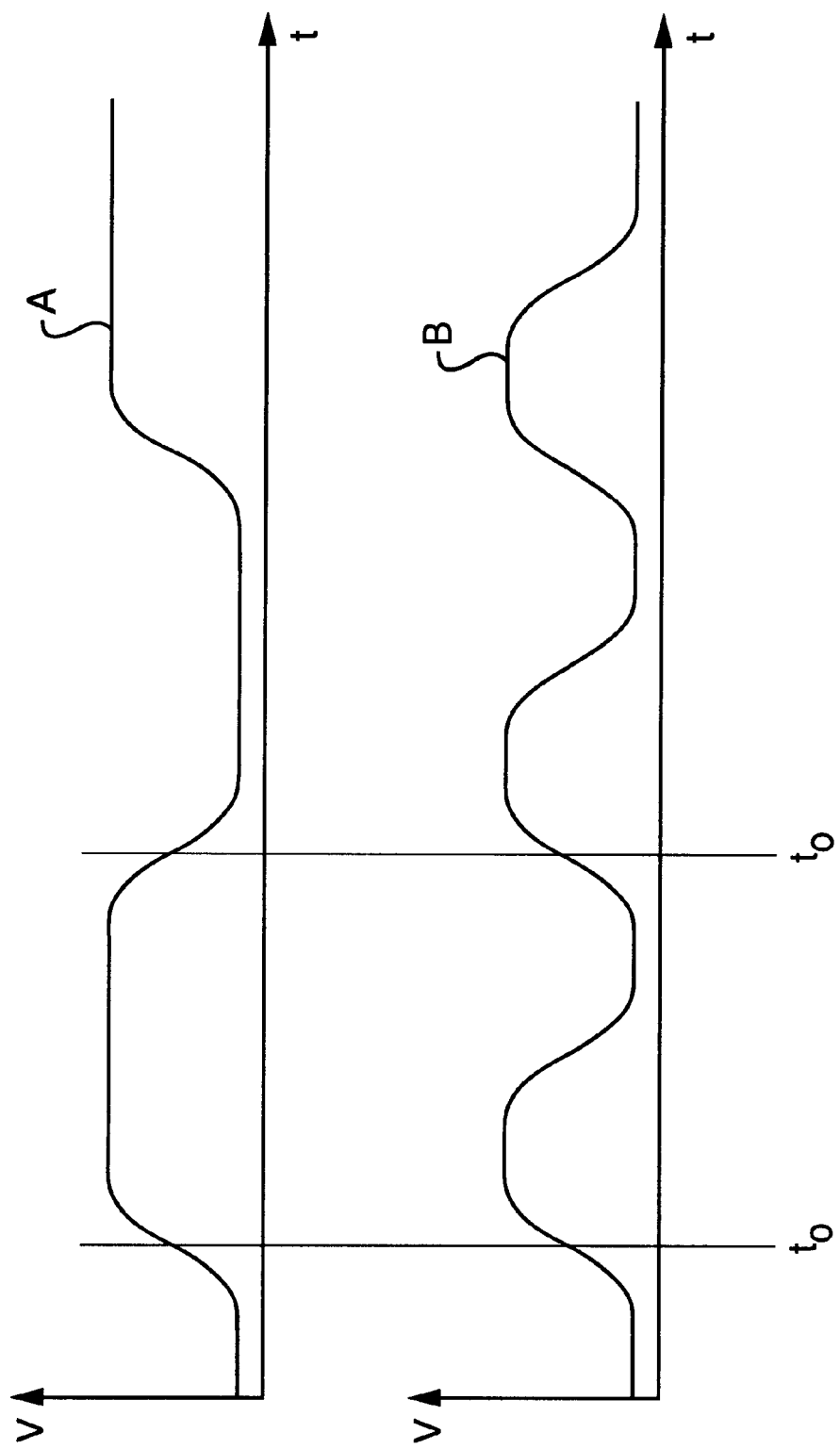
FIG. 1a is a timing diagram in which test signal A is the test signal applied to calibration modules of the present invention and clock signal B is the signal applied to devices under test.
Figure 4:
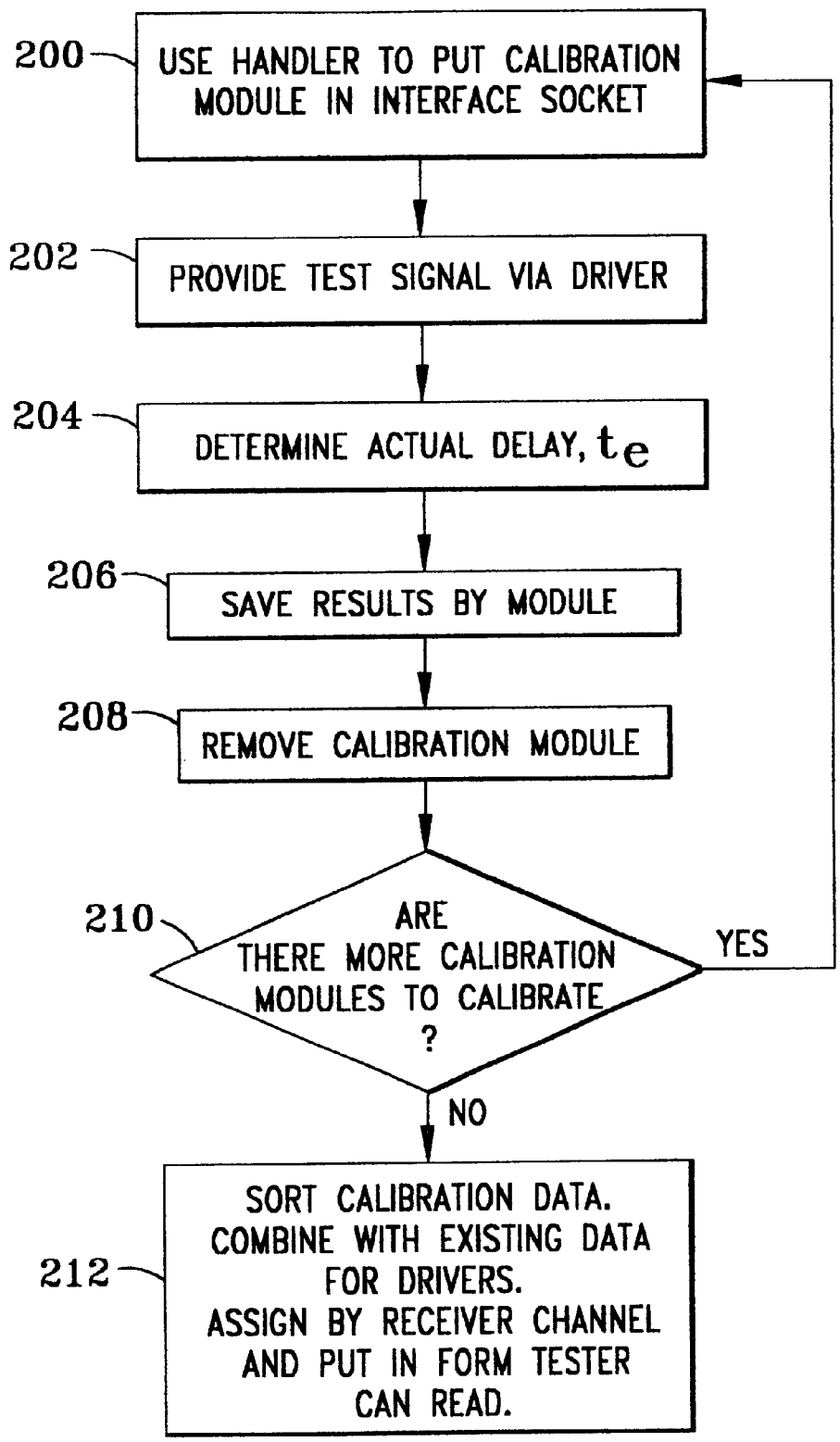
FIG. 4 is a flow diagram of the steps used in the calibration method of the present invention.

Tester 20 is programmed to provide test signal A on line 56 that simulates the signal that would be produced by an output of a functional device under test, as shown in FIG. 1a. This is accomplished by programming PDE 26 to modify clock signal B which is normally provided on line 56 to a clock input of devices under test. The modification produces rising and falling transitions in signal A at the same times as rising transitions would be provided in clock signal B. An external instrument, such as an oscilloscope, is used to align the timing edges of test signal A to clock signal B, as would be known to one of ordinary skill in the art.

Tester 20 also includes a receiver channel 30 having a control input connected to master clock 22 through PDE 32. The latter provides an offset to the clock signal generated by master clock 22 to account for delays introduced by elements of system 18 "downstream" from reference driver 24, e.g., receiver channel 30, fixtures, cables and the like. While only one receiver channel 30 and associated PDE 32 is illustrated, it is to be appreciated that tester 20 includes a plurality of receiver channels and associated PDEs, typically one receiver channel and PDE for each data output contact of the electronic component being tested. A bus 34 is connected to clock 22, PDE 26, the output of receiver channel 30 and PDE 32.

System 18 also includes an interface 50 having a socket 52 sized to receive an electronic component to be tested, hereinafter sometimes referred to as a DUT (device under test). Socket 52 includes a plurality of contactors 54 (the number illustrated being only exemplary), each for contacting and making an electrical connection with a corresponding respective input or output contact, e.g., a ball of a ball grid array, of the DUT. Socket 52 is connected via line 56 to the output of reference driver 24 and via line 58 to a data input of receiver 30. More particularly, although not illustrated, each contactor 54 is connected between reference driver 24 and a corresponding respective one of receiver channels 30. While only one socket 52 is illustrated in FIG. 1, it is to be appreciated that interface 50 may include multiple sockets, each connected to its own reference driver 24 and set of receiver channels 30.

System 18 further includes a controller 70 connected to bus 34 of tester 20 and handler 80, the latter being described in more detail below. Controller 70 is programmed to control the operation of tester 20 and handler 80, and to generate data used to sort each electronic component, also as described in more detail below. Controller 70 comprises a conventional digital computer such as a workstation of the type sold by Hewlett-Packard of Palo Alto, Calif., and identified by model number J210.

Handler 80 is used in connection with tester system 18 to position a DUT in socket 52 so that each contact or connection point, e.g., pin or ball of a ball grid array, of the DUT is electrically connected to a corresponding respective contactor 54. Following test, handler 80, under the control of controller 70, removes each DUT from socket 52 and positions it in a sort bin based on the results of the test performed by tester system 18. Although not illustrated, handler 80 is capable of simultaneously or sequentially positioning and removing DUTs from multiple sockets 52 of interface 50. A suitable handler 80 is sold by Delta Design of San Diego, Calif., and is identified as model RSS.

Figure 2:
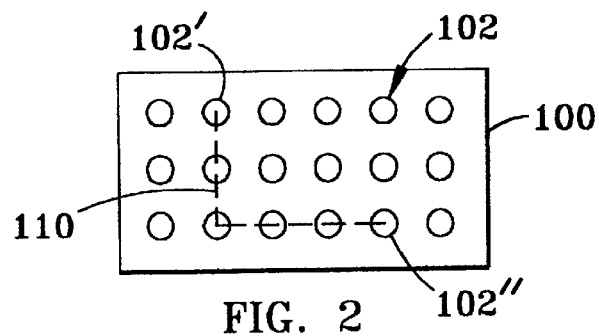
FIG. 2 is a top view of the calibration module of the present invention, with the transmission line connecting the reference clock input contact and a selected data output contact being shown in phantom view.

Referring now to FIG. 2, the calibration method of the present invention is achieved using a set of calibration modules 100 for each type, e.g., part number, of DUT. Calibration modules 100 are passive elements, i.e., they do not possess electrical function other than as described below. The number of calibration modules 100 in the set is determined by the number of contacts on the DUT from which output data is to be tested. Thus, if test data is to be acquired from 36 contacts on the DUT, then 36 different calibration modules 100 are required for such DUT, with the differences between the calibration modules in a given set discussed below.

Each calibration module 100 in a given set is preferably substantially the same size as the DUT to be tested so that it may be received in socket 52. Further, each calibration module 100 in a given set preferably includes a plurality of contacts 102 which are arranged so that each engages and makes an electrical connection with a corresponding respective one of contactors 54 in socket 52. In other words, contacts 102 are sized and arranged so as to correspond to the placement of the contacts of the electrical component to be tested. Alternatively, only two contacts 102 may be provided, with one contact positioned where the reference clock input contact of the DUT is located and the other contact being positioned where a given data output contact of the DUT to be evaluated is located, as described in more detail below.

Each calibration module 100 is preferably made from a conventional multi-layer printed circuit board, although other materials may also be employed in the construction of the calibration modules. Two of contacts 102, i.e., contacts 102' and 102", are electrically connected via transmission line 110 formed on or within calibration module 100. Contact 102' is positioned in the same location as the reference clock input contact of the DUT and contact 102" is positioned in the same location as one of the data output contacts of the DUT to be evaluated. Thus, as between different calibration modules 100 in a given set, the position of contact 102' remains fixed and the position of contact 102" will vary so as to correspond to the location of a corresponding respective DUT contact to be evaluated. For example, if 36 calibration modules 100 are included in a given set, contacts 102" will be positioned in 36 different positions, so that for a given calibration module the position of its contact 102" is unique relative to other contacts 102" of the other calibration modules in the set. When calibration module 100 includes a plurality of contacts 102, as is preferred, the contacts other than contacts 102' and 102" are typically not electrically interconnected. In any event, in a given calibration module 100, no contact other than contact 102" is connected by transmission line 110 with contact 102'.

Transmission line 110 is made from a material, and has a physical configuration, selected so as to have an impedance substantially matching the impedance of socket 52, lines 54 and 56, and other elements of tester system 20 involved in carrying a test signal between reference driver 24 and receiver channel 30. In a working embodiment of calibration module 100, transmission line 110 is made from conventional printed circuit material, such as FR-4, and its impedance is 50 Ohms at a 1 gigaHertz bandwidth. Furthermore, transmission line 110 is designed and made from a material that permits the transmission line to be substantially insensitive to changes in temperature. Transmission line 110 is further designed so as to provide an electrical path with a known time delay between contact 102' and contact 102" along which a test signal is carried. Preferably, this known delay is the same for the set of calibration modules 100 used in connection with a given electronic component. This is achieved by making identical the path length of all transmission lines 110 in a given set of calibration modules 100. Because the spacing between contact 102' and contacts 102" will vary, the spacing between the contact 102" farthest from contact 102' will determine the minimum length of transmission line 110 for all of the calibration modules 100. Although it is preferred that the known delay of all calibration modules 100 in a given set be identical, the present invention can accommodate different known delays between the calibration modules 100 in a set by appropriate modification of the program used by controller 70 to determine actual delay of a DUT, which determination is described in more detail below. In a working embodiment of the present invention, the known delay is 10 picoseconds.

Preferably, contacts 102 are gold plated pads to facilitate contact. Vias extending through the printed circuit board link gold plated pads 102 on one side to transmission line 110 on a layer within the board. The vias are filled with conductive epoxy to facilitate contact between gold plated contacts 102 and transmission line 110. A metal, such as tin-nickel, can be used to facilitate connection between the conductive epoxy and the gold. A blank second printed circuit board is adhesively connected to the printed circuit board containing transmission line 110 so the calibration module 100 has a size, shape and thickness to simulate a DUT, and so that it can be moved by the same handler 80 that is used for testing DUTs.

In connection with the following description of the method of calibrating tester system 18 to account for delays introduced "downstream" of reference driver 24, reference should be made to FIGS. 1–4. The method commences at step 200 with handler 80, under the control of controller 70, positioning a first calibration module 100 from a given set of calibration modules in socket 52 of interface 50. The calibration module 100 is positioned so that at least contacts 102' and 102" are in electrical contact with corresponding respective contactors 54 of socket 52. When calibration module 100 includes more than just contacts 102' and 102", each contact engages and is electrically connected to a corresponding respective contactor 54.

Figure 3:
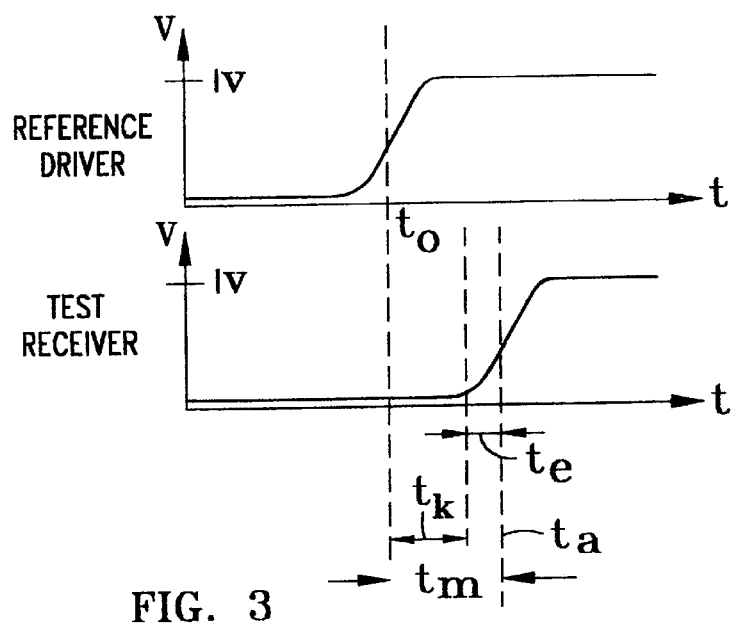
FIG. 3 is a timing diagram illustrating the relationship between a timing pulse at the driver and at a receiver channel.

Next, at step 202, clock 22 is triggered by controller 70 to provide a test signal to reference driver 24 including a train of pulses, with the leading edge of the pulse train being provided by the reference driver at to, as indicated in FIG. 1a and, in expanded form, in the upper timing diagram of FIG. 3. Preferably the test signal provided to the passive calibration module is programmed so that an output of the calibration module is substantially identical to an output of a functional electronic component. The test signal has voltage, pulse width, cycle time, or timing programmed to simulate the output of a functional electronic component. Transitions of the test signal are set to be substantially identical in time with transitions that would be applied to a functional electronic component. PDE 26 is programmed by controller 70 to account for delays introduced by reference driver 24 so that the test signal is delivered by the reference driver at $t_0$. The test signal is carried by line 56 to socket 52 where it is delivered via a contactor 54 to contact 102' of calibration module 100. After being carried through calibration module 100 via transmission line 110 to contact 102", the test signal exits the calibration module via a second contactor 54 and is carried by line 58 to receiver channel 30 connected via line 58 to the second contactor 54.

The time at which the leading edge of the test signal pulse train arrives at receiver channel 30, $t_a$, as indicated in the lower timing diagram in FIG. 3, is then determined. This is done by watching when data is first received on receiver channel 30 somewhat in advance of when data is first expected to be received based on the known delay, $t_k$, provided by calibration module 100.

For example, for a calibration module 100 having a known delay of 10 picoseconds, controller 70 causes clock 22 to generate signals used to strobe receiver channel 30 so as to provide data at 7 picoseconds after $t_0$. Eventually, receiver channel 30 detects the presence of the timing signal at $t_a$, for example at 12 picoseconds after $t_0$. The measured delay $t_m$, between $t_0$ and $t_a$, is made up of the known delay $t_k$ and the actual delay $t_e$ introduced by elements of tester 20 "downstream" of reference driver 24. Thus, actual delay $t_e$ is determined by subtracting the known delay $t_k$ from $t_m$, as indicated by step 204. In practice, $t_k$ is subtracted from $t_e$. If desired, delays may be measured with respect to the leading edge of multiple pulses in the test signal pulse train, with the results being averaged or otherwise combined to achieve a single actual delay $t_e$ for each receiver channel 30.

Next, at step 206, actual delay $t_e$ is stored by controller 70 for the calibration module 100 with respect to which it was calculated. At step 208, handler 80 is caused by controller 70 to remove calibration module 100 from socket 52.

The preceding calibration method is then repeated for each calibration module 100 in the set for a given DUT as a consequence of step 210. There, controller 70 determines whether all calibration modules 100 have been tested. If not, the process loops back to step 200 where a new calibration module 100 is positioned by handler 80 in socket 52. As a result of this process, the actual delay $t_e$ for the each calibration module 100, and hence for each receiver channel 30, is determined, as described above. While not preferred, if the known delay for the calibration modules 100 in a set is not the same, the preceding determination of actual delay $t_e$ is made for a given receiver channel 30 based on the known delay $t_k$ for that receiver channel.

Finally, when all calibration modules 100 have been tested, the process proceeds to step 212. There, calibration data, i.e., actual delay $t_e$, previously acquired is sorted by receiver channel 30 to which it pertains. Next, the actual delay associated with reference driver 24, which is previously acquired by known methods, is combined with actual delay for each of receiver channels 30. This creates a total actual delay for the entire tester system 18, which is made up of total actual delays associated with each receiver channels 30. Because each receiver channel 30 is associated with a corresponding respective data output contact of the DUT, total actual delay calibration offsets are thus established for the DUT. Finally, the total actual delay for each receiver channel 30, i.e., actual delay $t_e$ plus the actual delay for reference driver 24, is converted to a form that may be provided to its PDE 26 and the all of the PDEs 32 so as to account for delays in the entire tester system 18.

While not illustrated, because interface 50 typically includes multiple sockets 52, the preceding calibration method may be performed simultaneously with respect to each of the sockets in the interface. The various calibration modules 100 in the sets associated with each socket 52 may be installed and removed from the socket in the same or in different order as the calibration modules for other sockets.

At this stage in the calibration method, controller 70 has determined and stored an actual delay $t_e$ for each receiver channel of receiver channel 30, for each socket 52 in interface 50. Actual delay $t_e$ is then used by controller 70 in programming an appropriate delay in PDE 32 so as to offset by the amount of the actual delay $t_e$ the time at which data output is first considered received by the receiver channel 30 for each data output contact of the DUT. The calibration method described above must be used for each type of DUT, as identified by, e.g., separate part numbers, so that controller 70 may appropriately program the PDE 32 for the type of DUT being tested.

Production testing of electronic components using tester system 18 and handler 80 calibrated in accordance with the foregoing method begins in the conventional manner. Under the control of controller 70, handler 80 positions a DUT in socket 52. Then, tester 20 provides a test signal via reference driver 24 and other drivers (not shown) of the tester to the DUT in socket 52. The output from the DUT is then received by receiver channels 30, with the timing of the output for each receiver channel being adjusted by its associated PDE 32 to provide an offset equal to actual delay $t_e$ so as to determine access time for the DUT. Based on the test results so obtained, controller 70 causes handler 80 to remove the DUT from socket 52 and position it in a sort bin (not shown) corresponding to the access time determined in the manner described above. Typically, a given type of DUT has 4–8 sort categories, with an associated sort bin being provided for each category.

Because the true delay arising from elements in tester system 18 "downstream" of reference driver 24 is accurately accounted for by the calibration method described above, the guardband associated with such downstream elements can be reduced considerably. This has the resultant benefit of pushing a certain number of the DUTs into higher sort categories, which command higher prices. As a result, without changing the manufacturing process for the DUTs, total revenue is increased.

In addition to increasing revenue for the electronic components being tested, the calibration method of the present invention possesses several other advantages. Because calibration module 100 is a passive element, its operating characteristics do not change with time due to temperature changes arising from operation. Calibration testing with active "golden devices" is inherently unreliable because the operating parameters of the golden devices necessarily change with operation.

Unlike known tester calibration methods which typically take three to four hours to complete, and so are necessarily used on a relatively infrequent basis, the calibration method of the present invention takes only about 15 minutes to complete. As such, the method may be used on a frequent basis, e.g., once a week, thereby ensuring high reliability of test results.

The calibration method described above has been presented in the context of a test method in which access time of the DUT is the characteristic of primary interest. However, the present invention is not so limited. For example, when the DUT is a logic device such as a microprocessor or ASIC, the present calibration method may be used in connection with determining propagation delay.

Since certain changes may be made in method and system described above without departing from the scope of the present invention, it is intended that all matter contained in the above description or shown in the accompanying drawings shall be interpreted in an illustrative and not in a limiting sense.

What is claimed is:

1. A method of calibrating a tester used to test an electronic component, the tester having a driver, a receiver channel, and an interface for connecting the driver and the receiver channel to the electronic component, the method comprising the steps of:
   a. providing a passive calibration module having an electrical path with a known delay;
   b. connecting said calibration module with the interface so that a test signal may be provided to said calibration module via the driver and carried by said electrical path to the receiver channel; and
   c. providing the test signal via the driver at $t_0$.

2. A method according to claim 1, further including the step, after said providing step (c), of:
   d. measuring the actual delay between $t_0$ and the time when the test signal is received by the receiver channel.

3. A method according to claim 2, further including the step, after said measuring step (d), of:
   e. determining a calibration offset by comparing said known delay with said actual delay.

4. A method according to claim 3, further including the step, after said determining step (e), of:
   f. using said calibration offset in connection with the testing of an electronic component.

5. A method according to claim 3, further including the step, after said determining step (e), of:
   f. using said calibration offsets determined in said determining step (e) in connection with the testing of an electronic component.

6. A method according to claim 2, wherein in said providing step (c) said test signal provided by the driver has a pulse with a pulse edge and in said measuring step (d) said actual delay is measured with respect to time of receipt of said pulse edge.

7. A method according to claim 6, wherein in said providing step (c) said test signal provided by the driver includes a plurality of pulses, each having a pulse edge, and in said measuring step (d) said actual delay is measured with respect to time of receipt of each of said pulse edges.

8. A method according to claim 1, said tester having a plurality of receiver channels, the method further comprising the steps, after said providing step (c), of:
   d. providing a plurality of calibration modules, each having an electrical path with a known delay; and
   e. sequentially connecting each of said calibration modules between the driver and a corresponding respective one of the receiver channels so that a test signal may be provided to said each calibration module via the driver and carried by said electrical path to the corresponding respective receiver channel; and
   f. providing the test signal via the driver at $t_0$ to said each calibration module.

9. A method according to claim 8, further including the step, after said providing step (f), of:

g. measuring the actual delay between $t_0$ and the time when the test signal is received by each of the receiver channels.

10. A method according to claim 9, further including the step, after said measuring step (g), of:

h. determining a calibration offset for each of said plurality of receiver channels by comparing said known delay for said each calibration module connected with said each receiver channel with said actual delay for said each calibration module.

11. A method according to claim 1, wherein said connecting step (b) includes the step of positioning said calibration module in the interface with a handler used for providing the electronic components to the tester.

12. A method according to claim 1, the interface comprising a socket having a plurality of contactors, wherein said connecting step (b) includes connecting the contactors to the electrical path.

13. A method according to claim 1, wherein said test signal provided to said passive calibration module is programmed so that an output of said calibration module is substantially identical to an output of a functional electronic component.

14. A method according to claim 13, wherein said test signal has transitions substantially identical in time with transitions applied to a functional electronic component.

15. A method according to claim 14, wherein said test signal has voltage, pulse width, and cycle time programmed to simulate the output of a functional electronic component.

16. A method according to claim 1 wherein said electrical path includes a transmission line.

17. A method according to claim 16, wherein said transmission line has characteristics that are insensitive to temperature.

18. A method according to claim 1, the driver including a plurality of drivers, one driver of which is a reference for the others.

19. A method according to claim 18, wherein the one driver is used a reference for sorting the electronic components based on access time.

20. A method according to claim 1, wherein said calibration module has dimensions substantially identical with dimensions of the electronic component.

21. A method according to claim 1, wherein said electrical path includes a metal line on a printed circuit board.

22. A method according to claim 21, wherein said electrical path includes gold plated pads to facilitate contact the path.

23. A method according to claim 21, wherein said electrical path includes a via in said printed circuit board and conductive epoxy in said via to facilitate contact between said gold plated pads and said metal line.

24. A method according to claim 21, further comprising a blank second printed circuit board facing said metal line.

25. A method of calibrating tester receiver channels before testing electronic components, comprising:

a. providing a tester for testing electronic components, the tester comprising a plurality of receiver channels;

b. passing a test signal through a calibration module that introduces a known delay and then providing said test signal to at least one of said receiver channels;

c. performing a measurement of said known delay; and d. calibrating said receiver by comparing said known delay with said measurement of said known delay and creating an offset based on a difference between said known delay and said measurement of said known delay.

26. A method as recited in claim 25, wherein said providing step (b) is performed for each receiver channel of said tester.

27. A tester calibration system for testing a DUT having a reference clock contact and a plurality of data output contacts, the system comprising:

a. a tester;

b. a socket for receiving a DUT, said socket being connected to said tester and having a plurality of contactors for making electrical contact with the reference clock contact and the plurality of data output contacts of the DUT; and c. a plurality of calibration modules, each having a first contact, a second contact and a transmission line with a known delay connected between said first contact and said second contact, wherein each of said plurality of calibration modules (i) is sized for receipt in said socket, (ii) has said first contact positioned to contact said contactor that contacts said reference clock contact of the DUT and (iii) has said second contact positioned to contact a corresponding respective one of said contactors that is different than ones of said contactors that said second contacts on others of said plurality of calibrations modules contact.

28. A system according to claim 27, further including a controller that determines access time sorts for DUTs tested with said system by taking into consideration calibration offsets determined based on said known delays for said plurality of calibration modules.

* * * * *

UNITED STATES PATENT AND TRADEMARK OFFICE
CERTIFICATE OF CORRECTION

PATENT NO. : 6,347,287 B1
DATED : February 12, 2002
INVENTOR(S) : Beckett et al.

It is certified that error appears in the above-identified patent and that said Letters Patent is hereby corrected as shown below:

Column 9,
Line 39, please add the word as to claim 19
 19. A method according to claim 18, wherein the one drive is used as a reference for sorting the electronic components based on access time.

Signed and Sealed this

Fifth Day of November, 2002

Attest:

Attesting Officer

JAMES E. ROGAN
Director of the United States Patent and Trademark Office